United States Patent [19]
Fuller et al.

[11] Patent Number: 5,583,074
[45] Date of Patent: Dec. 10, 1996

[54] SEMICONDUCTOR CIRCUIT

[75] Inventors: Clyde R. Fuller, Plano; Joseph B. Delaney, Dallas; Robbie W. Skinner, Plano, all of Tex.

[73] Assignee: Texas Instruments Incorporated, Dallas, Tex.

[21] Appl. No.: 475,931

[22] Filed: Jun. 7, 1995

Related U.S. Application Data

[60] Continuation of Ser. No. 764,994, Sep. 24, 1991, which is a division of Ser. No. 78,332, Jul. 27, 1987, Pat. No. 5,055,908.

[51] Int. Cl.$^6$ .................................................. H01L 29/80
[52] U.S. Cl. .................. 437/184; 437/187; 437/203; 204/192.15; 204/192.17
[58] Field of Search .................................. 437/184, 187, 437/203; 204/192, 192.17

[56] References Cited

U.S. PATENT DOCUMENTS

| | | | |
|---|---|---|---|
| 3,856,647 | 12/1974 | Blachman | 204/192 |
| 4,436,582 | 3/1984 | Saxena | 156/656 |

FOREIGN PATENT DOCUMENTS 149173  8/1985  Japan.

OTHER PUBLICATIONS

M. Hill, "Magnetron Sputtered Titanium–Tungsten Films," Solid State Technology, vol. 23, No. 1, Jan. 1980, pp. 53–59.

*Primary Examiner*—Robert Kunemund
*Attorney, Agent, or Firm*—René E. Grossman; Richard L. Donaldson

[57] ABSTRACT

The disclosure relates to a semiconductor circuit on a single chip, preferably of gallium arsenide, wherein insulating layers with vias therein for receiving metallization include a thin silicon nitride layer beneath a relatively much thicker silicon oxide layer with the nitride exposed on the via side walls to contact gold in the metallization within the via. The disclosure further includes metallization formed as a TiW/Au/TiW sandwich wherein the TiW layer contacting the insulator on the substrate is formed of a first tensile film of TiW with a compressive film of TiW of substantially the same thickness thereover and in contact therewith to lower the tensile force applied by the tensile layer, yet maintain the resultant force tensile.

19 Claims, 5 Drawing Sheets

SEMICONDUCTOR CIRCUIT

This application is a continuation of application Ser. No. 07/764,994, pending, filed Sep. 24, 1991, which is a division of Ser. No. 07/078,332, filed Jul. 27, 1987, now U.S. Pat. No. 5,055,908.

BACKGROUND OF THE INVENTION

1. Field of the Invention

This invention relates to a semiconductor circuit, preferably one formed from a Group III–V compound and, more specifically, to improvements in dielectric and metallization parameter value determination therefor.

2. Brief Description of the Prior Art

In the fabrication of semiconductor circuits from Group III–V compounds, gold and gold alloys are the most commonly employed metals for making electrical contact to the device substrate. These contacts, as well as the first level of interconnect, are usually formed by a lift off process, wherein a dielectric, typically plasma deposited silicon nitride, is deposited onto the surface of the Group III–V semiconductor wafer. The wafer is coated with a photosensitive masking material, the masking material is exposed through a patterned reticle, and then developed to leave an appropriate pattern on the dielectric surface. The exposed dielectric is then etched away, typically using plasma etching, then slightly undercut to ensure that metal evaporated onto the semiconductor substrate through the masking material will not be continuous over the mask pattern and dielectric side walls. A solvent for the masking material is then employed to dissolve the masking material by attacking it through the discontinuity in the evaporated metal and "lifting off" the metal that is on the dissolved masking material. Once all of the contacts are formed, the semiconductor wafer is appropriately cleaned, and a second dielectric layer is plasma or CVD deposited. In the prior art, this dielectric has typically been silicon dioxide. Silicon dioxide has poor adhesion to gold. This poor adhesion of silicon dioxide to gold often leads to a continuity failure.

Also, in the prior art, as stated hereinabove, interconnect metalization was largely provided by lift-off patterning. This technique suffered both from limitations in device complexity available to obtain reasonable yield using the technique and also from reliability problems. GaAs circuits are often required to operate in high radiation environments, and a characteristic of gold based interconnect is that soft x-ray absorption can produce excessive heating of the gold. The resulting coefficient of thermal expansion-induced stresses cause the deposited interconnect and insulating dielectrics to separate.

SUMMARY OF THE INVENTION

In accordance with the present invention, the above noted deficiencies in the formation of prior art semiconductor circuits, particularly but not limited to gallium arsenide, are minimized and there is provided a semiconductor integrated circuit wherein the dielectric is designed to provide improved adhesion to contacts, especially gold contacts, wherein the metallization is designed to provide improved adherability to the substrate as well as the dielectric without causing cracking as in the prior art.

This invention employs an all sputter deposited, pattern etched TiW-Au interconnect and plasma deposited interlevel insulation. In general, evaporated or sputtered metal films in tensile stress exhibit better adhesion to $SiO_2$ than do those in compressive stress. It is, therefore, important for the metal films to be in tensile stress. In the case of TiW-Au, since stress in the gold film cannot deform the TiW layer, the primary impact on the TiW-SiO2 interface will be from the stress in the TiW film. This stress can be controlled from highly tensile to highly compressive by the deposition pressure. The stress of sputtered TiW films will vary from $2\times10$ dynes/sq. cm. compressive to $2\times10^{10}$ dynes/sq. cm. tensile over the deposition pressure range of 5 mTorr to 20 mTorr. While adhesion of TiW to $SiO_2$ is poor for the compressive deposition conditions, it is excellent for the tensile deposition conditions. TiW films of 2000±250 angstroms, deposited at 20 mTorr, have exhibited stress sufficient to crack and peel up the $SiO_2$-Si interface of thermally oxidized silicon with no adhesion failure of the TiW-$SiO_2$ interface. In the method of this invention, the excellent adhesion of the 20 mTorr deposition TiW films is obtained while controlling the overall film stress to 2 to $3\times10^9$ dynes/sq. cm. tensile by depositing the TiW in 500 to 750 angstrom thick layers. The initial layer is deposited at 20 mTorr followed by a second layer at 5 mTorr. The approximately equal but opposite stresses compensate each other, resulting in the desired level of tensile stress. Gold, deposited at a wide range of conditions, has little impact on the film stress.

Silicon dioxide, which adheres extremely well to aluminum, does not adhere to gold. To eliminate the potential of dielectric lift over gold contact and interconnect sidewall surfaces, a 200 angstrom silicon nitride layer is deposited prior to the silicon dioxide layer, providing excellent dielectric to gold adhesion.

With lift-off patterned evaporated Ti-Pt-Au leads, loss of metal adhesion has been observed to result from soft x-ray absorption induced thermal stress in gold based high Z interconnect. Assuming Young's Modulus and coefficient of linear thermal expansion values for TiW fall intermediate to those for W and Ti, the films should have to absorb a sufficient dose to experience delta t's above 300 degrees C. before TiW-Au films will go into compressive stress. Actual tests have shown that multilevel interconnect formed by the method of this invention are not subject to this failure mechanism.

In conventional GaAs circuit fabrication technology, first level interconnect is produced by lift-off, with first level leads lying directly on the GaAs surface. While the insulating nature of the GaAs is sufficient to provide isolation between adjacent first level leads under normal circumstances, high doses of ionizing radiation will produce hole-electron pairs in the insulating GaAs layer, temporarily shorting between these leads. In the method of this invention, only the contacts to the GaAs substrate are formed by lift-off. The balance of the interconnect is sputter deposited over a thick dielectric, then pattern etched. The result is lower capacitance between the interconnect and the device surface, producing improved device performance, and enhanced radiation tolerance.

Lift-off has been employed extensively for GaAs circuit fabrication and is the principal technology for forming contact geometries. High density interconnect geometries, however, are more readily formed at high yield by pattern etching of deposited metal films. It is the method of this invention to form all interconnect levels by sputter deposition and subsequent pattern etching. While thermal evaporation is mandatory to achieve the peculiar coverage needs of a metal patterning lift-off process, sputtering with its improved adhesion and step coverage is the deposition process of choice for interconnect geometry formation by pattern etching.

In accordance with the present invention, the above noted deficiencies in the formation of prior art semiconductor circuits, particularly but not limited to gallium arsenide, are minimized and there is provided a semiconductor integrated circuit wherein the dielectric is designed to provide improved adhesion to contacts, especially gold contacts, wherein the metallization is designed to provide improved adherability to the substrate as well as the dielectric without causing cracking as in the prior art.

Briefly, in accordance with the present invention, a relatively thick layer of silicon oxide is formed over a relatively thinner layer of silicon nitride as the dielectric beneath the first metal layer as well as between metal layers. The nitride layer is as thin as possible subject to being capable of making adequate contact with the gold contacts in vias formed therein to prevent peeling or lifting thereof from the via walls. The oxide layer is of sufficient thickness to provide the desired insulation properties. Silicon nitride has great adhesion to gold, perhaps because the silicon nitride as-deposited normally contains excess silicon, i.e., is not stoichiometric. On the other hand, TiW has good adhesion to silicon oxide. Therefore, in accordance with the present invention, the formation of dielectric layers with vias formed therethrough for the purpose of receiving contacts therein will cause the side walls of the vias to contact the contacts. In accordance with one aspect of the present invention, dielectric is formed having a lower relatively thin layer of silicon nitride with a relatively thicker layer of silicon oxide thereover. In this manner, when vias are formed, gold contacts disposed in the vias will make contact with the silicon nitride and thereby provide a superior bond thereto than is the case of a single layer of silicon oxide. The nitride layer is as thin as possible, as long as it retains sufficient thickness to adequately adhere to the gold contact. A layer of about 200 angstroms has been found to operate quite well for the above described purpose. The oxide layer is of predetermined thickness as required to provide the desired insulating properties in the device being fabricated. A thickness of about 6000 angstroms has been found to operate well in practice.

In accordance with the present invention, metallization in the form of a sandwich structure is provided using a TiW/Au/TiW arrangement. The bottom TiW layer is formed as two films whereby each film has different physical properties for optimization for good adhesion and low net stress. The technical problem is that more tensile TiW films have better adhesion to dielectrics, but a film which has a high net tensile stress may result in mechanically unsound integrated circuits which may result in cracking of the underlying dielectrics. On the other hand, the adhesion to substrates of compressive TiW films is typically very poor. Therefore the TiW film must not be compressive at the interface thereof and the underlying dielectric or peeling may result. To achieve low net stress with good adhesion, the present invention teaches that the TiW layer should be deposited as two films, the first film being deposited as a tensile film for good adhesion and the second film being deposited thereover as a compressive film to balance out the net stress. To control the stress qualities of the film, the deposition pressure is varied. Sputter deposition in argon at a pressure of 8 or 9 milliTorr will provide a film stress of approximately zero. To achieve a tensile TiW film, the pressure (of argon) is set at 20 milliTorr and to achieve a compressive film the pressure is set at a pressure less than 8 milliTorr, such as five milliTorr. For a 2000 Angstrom total TiW thickness, 1000 angstroms of each type of film is deposited. For thicker films, the layers will be alternated as many times as is required. The stress at the interface is preferably selected to be in the general neighborhood of $1 \times 10^9$ dynes/square centimeter tensile. This is achieved, for example, with a $2.0 \times 10^{10}$ dynes/cm$^2$ compressive film deposited over a $2.1 \times 10^{10}$ dynes/cm$^2$ tensile film.

If a lower nominal stress at the interface is targeted, the film may occasionally go compressive at the interface, resulting in poor adhesion. The preferred complete metal structure is preferably a TiW/Au/TiW sandwich structure with thicknesses of 400 angstroms for the top TiW film, 5000 angstroms of gold and 2000 angstroms for the bottom layer of TiW. The top TiW layer serves as an anti-reflective layer and is optional. The metal etch during device fabrication is preferably timed to stop in the bottom TiW layer so that a TiW etch can be used to finish the metal etching process and possible auto-doping from the gold layer is avoided. The innovations described herein insure that the bottom TiW layer will have good net adhesion to the underlying dielectric and also have low net film stress.

The end result of use of each of the above described concepts is the production of a semiconductor device, preferably but not necessarily of gallium arsenide, wherein insulating layers adhere to the substrate with minimal cracking and metallization, especially gold metallization, adheres to the insulating layers.

DESCRIPTION OF THE PREFERRED EMBODIMENTS

Figure 1:
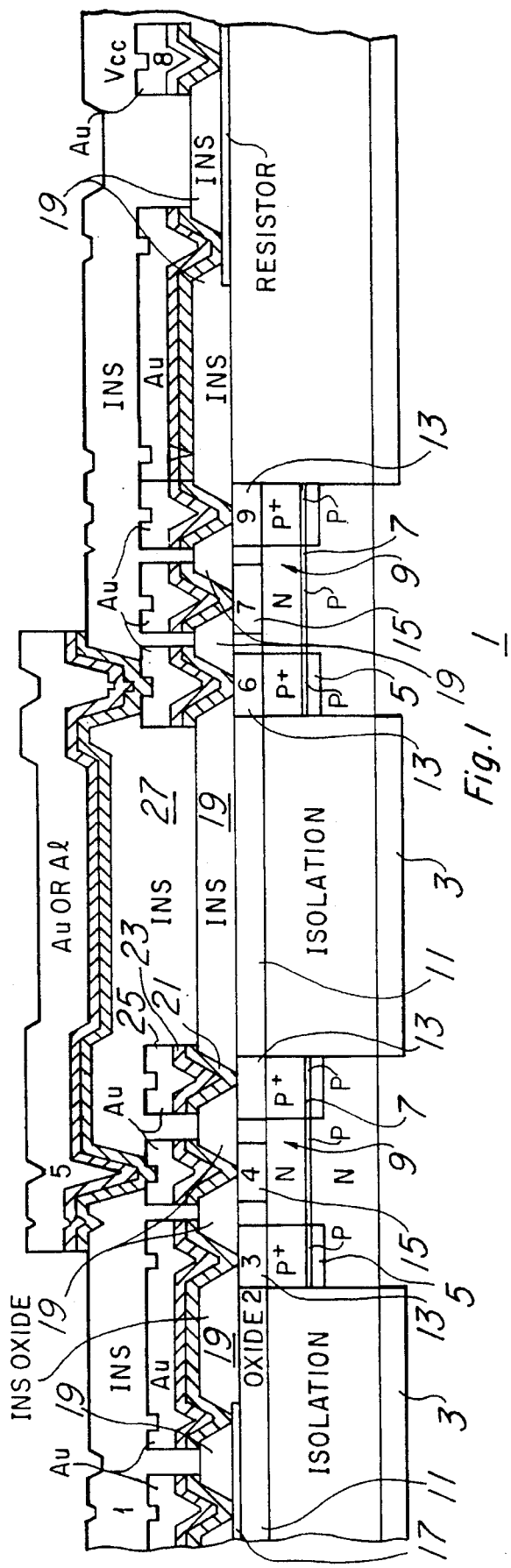
FIG. 1 is a schematic diagram of a cross section of an integrated circuit formed using the present invention.

Referring first to FIG. 1, there is shown an electronic circuit fabricated on a single chip using the features of the present invention as set forth hereinabove. The circuit includes a substrate 1, which in the preferred embodiment, is N-type gallium arsenide. The circuit includes standard isolation regions 3 which isolate the different transistor circuits in the chip from each other. Each transistor circuit includes P+ regions 5 and 7 which form the emitter and collector regions with the base 9 therebetween. An insulating region 11, preferably a silicon oxide, is situated over the isolation region and appropriate contact material 13 and 15 is provided over the emitter, collector and base regions. A thin film resistor 17 is disposed over the insulating layer 11, with a further insulating layer 19 disposed over the entire chip with vias therein as will be discussed hereinbelow.

The insulating layer 19 is deposited as a relatively thick silicon oxide 6000 angstrom thick layer over a relatively thin 200 thick angstrom silicon nitride layer. Vias are formed in the insulating layer 19 so that the silicon nitride is located at part of the exposed side walls thereof. The vias are filled with metallization which is composed of a pair of different films of TiW 21 and 23 followed by a layer of gold 25 with an optional layer of TiW thereover (not shown). The fact that the silicon nitride is exposed on the via sidewalls during metallization insures that any gold contacting the via side walls will adhere to the nitride.

The metallization is provided by forming a first TiW tensile film having a thickness of about 1000 angstroms and then forming a second compressive film of TiW thereover having a thickness of about 1000 angstroms. If thicker TiW metallization is required, additional first and second TiW films of about 1000 angstroms thickness or less per film are alternated until the desired thickness is obtained. The tensile film will always be in contact with the insulating layer since it has much better adhesion properties than does the compressive film. The second film is deposited as a compressive film to balance out the net stress.

To control the stress qualities of the film, the deposition pressure is varied. Sputter deposition at a pressure of 8 or 9 milliTorr will provide a film stress of approximately zero. To achieve a tensile TiW film, the pressure of argon is set at 20 milliTorr and to achieve a compressive film the pressure is set at a lower pressure, e.g., five milliTorr. For a 2000 angstrom total TiW thickness, 1000 angstroms of tensile TiW is deposited on the dielectric and in the vias by sputter depositing the TiW in an argon atmosphere at a pressure of 20 milliTorr. The pressure of the argon was then changed to 5 milliTorr and 1000 angstroms of compressive TiW was then deposited over the tensile film of TiW by sputter depositing. The stress at the interface of the insulator and TiW is preferably selected to be in the rough neighborhood of $1 \times 10^9$ dynes/square centimeter tensile, this stress having been obtained from the above described combination of TiW films. If a lower nominal stress is targeted, the film may occasionally go compressive at the interface which would result in poor adhesion. The complete metallization preferably has 2000 angstroms of TiW for the bottom layer in two films as described above, 5000 angstroms of gold thereover and an optional layer of 400 angstroms of TiW over the gold. The top TiW layer serves as an anti-reflective layer.

Figure 2:
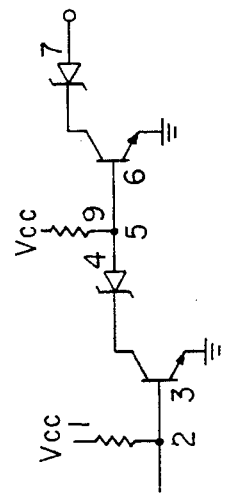
FIG. 2 is a circuit diagram of the circuit of FIG. 1.

The metallization, as shown in FIG. 1, contacts the resistor 17 at two spaced locations thereon to provide a resistor therebetween. This resistor is shown in the circuit of FIG. 2 between points 1 and 2. The metallization also passes from the resistor 17 to the contact 13 on region 5 over the insulator 19 to connect together points 2 and 3 in FIG. 2. Metallization is also shown over contact 13 on the right and 15. Similar connections are shown in connection with the second device to the right of FIGS. 1 and 2.

To interconnect circuits on a single chip and/or provide additional layers of metallization, an insulating layer 27, similar to insulating layer 19, is provided as shown in FIG. 1 with vias therethrough and metallization thereon. Since the contact 15 provides a schottky diode with the substrate 1 as shown at 4 in FIG. 2, the two layers of metallization thereabove connect point 5 to the diode at point 4 as well as to point 6 through the metallization and via over point 6. Point 6 is connected to point 9 by metallization, not shown, with point 9 being connected via metallization and resistor 17 to provide the resistor shown in FIG. 2 between point 8 and 9. The contact at point 7 forms the schottky diode as noted in FIG. 2.

The processing steps per se required to form the circuit of FIG. 1 are standard and well known to those skilled in the art and form no part of this invention. However the combination of steps herein is unique as is demonstrated hereinbelow with reference to FIGS. 3 to 13.

Figure 3:
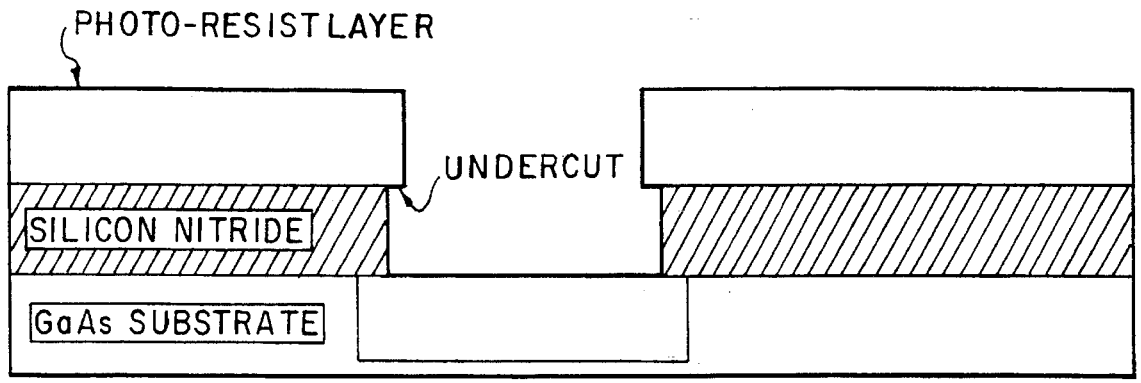
FIGS. 3 to 13 disclose the circuit structure at several points in the process flow utilized in accordance with the present invention.
Figure 4:
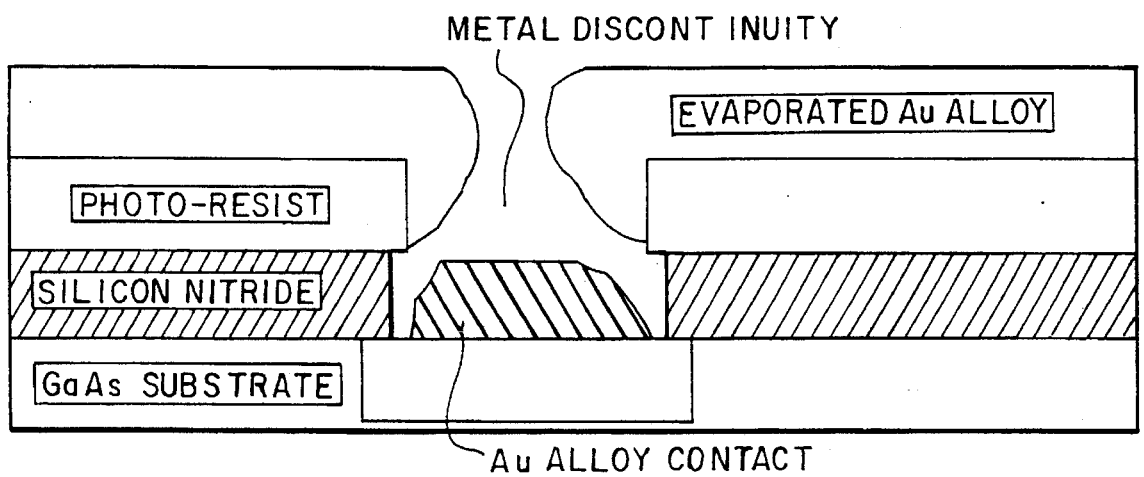

Referring now to FIG. 3, there is shown the gallium arsenide substrate 51 having a plasma deposited silicon nitride layer 51 thereon. The nitride layer 53 is coated with a photoresist layer 55 which is patterned with the exposed silicon nitride being plasma etched and slightly undercut at 57 to provide the structure of FIG. 3. The undercut ensures that metal evaporated onto the semiconductor substrate through the masking material will not be continuous over the mask pattern and dielectric side walls. A gold alloy is then evaporated over the structure of FIG. 3 to provide the structure of FIG. 44 with the gold alloy metal contact 59 separated from the gold alloy 61 over the photoresist. A solvent for the photoresist mask 55 is them employed to dissolve the mak through the discontinuity with concomitant lift-off of the metal layer 61 thereon, leaving the structure of FIG. 5.

Figure 5:
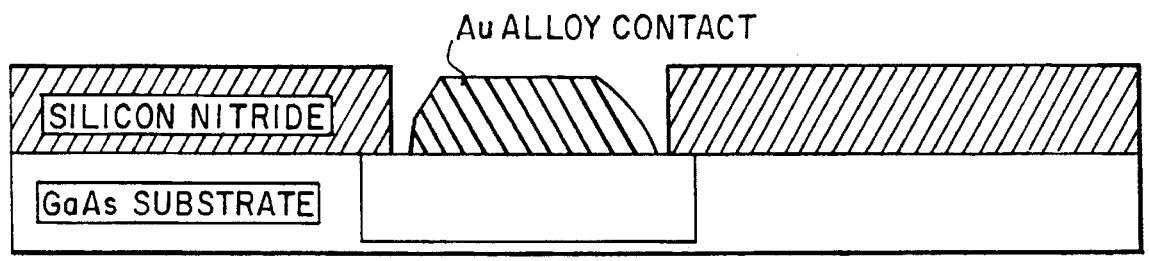
Figure 6:
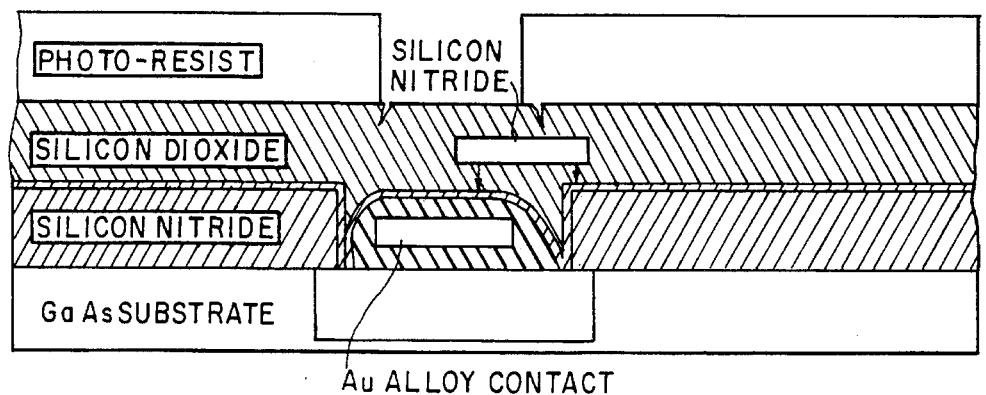
Figure 7:
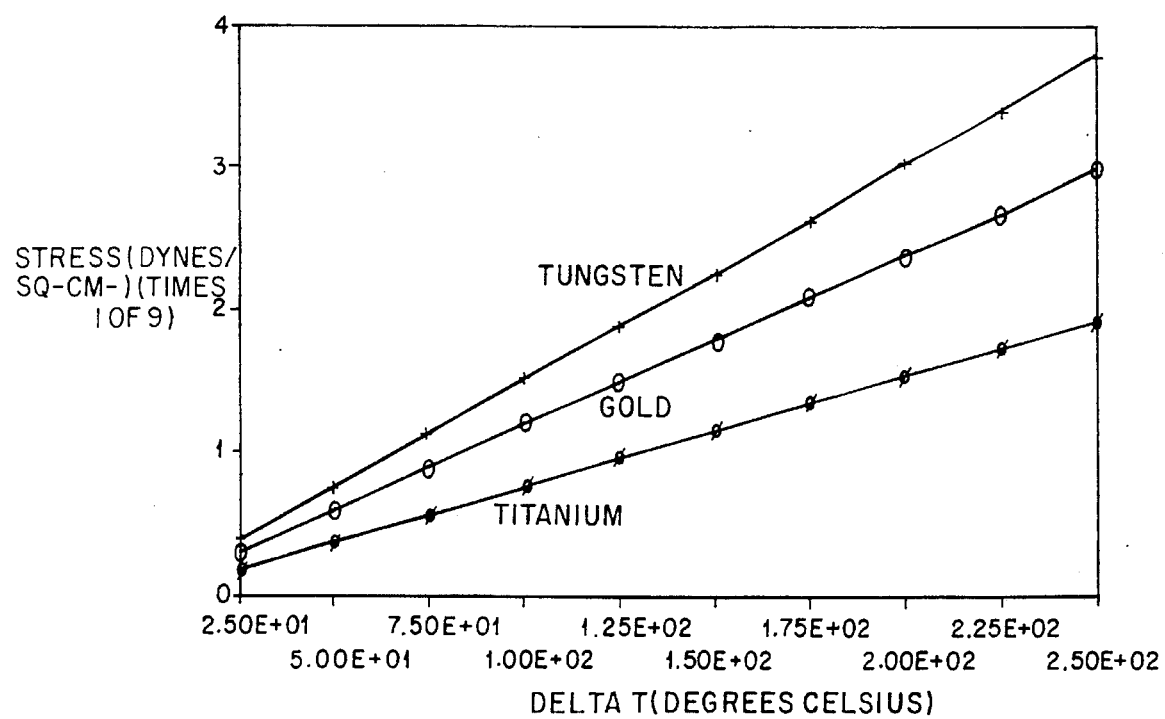
Figure 8:
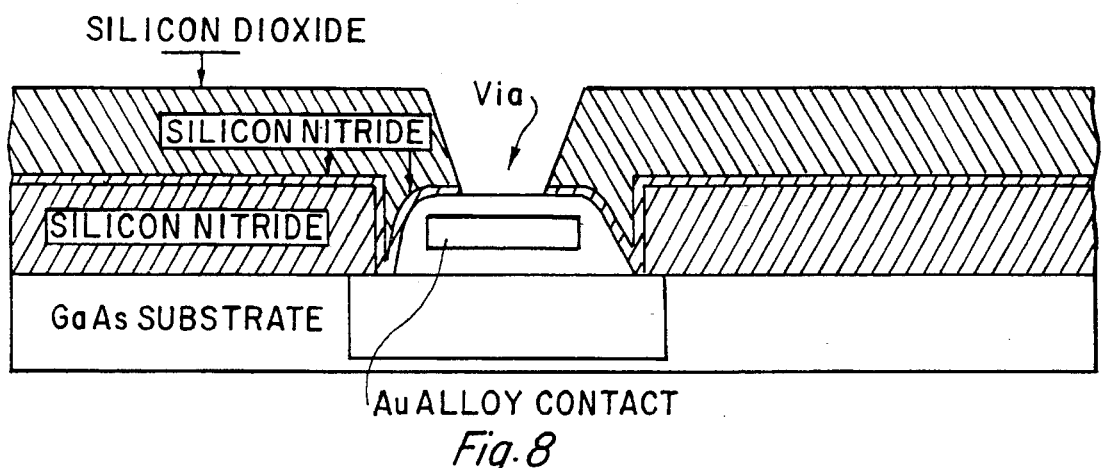
Figure 9:
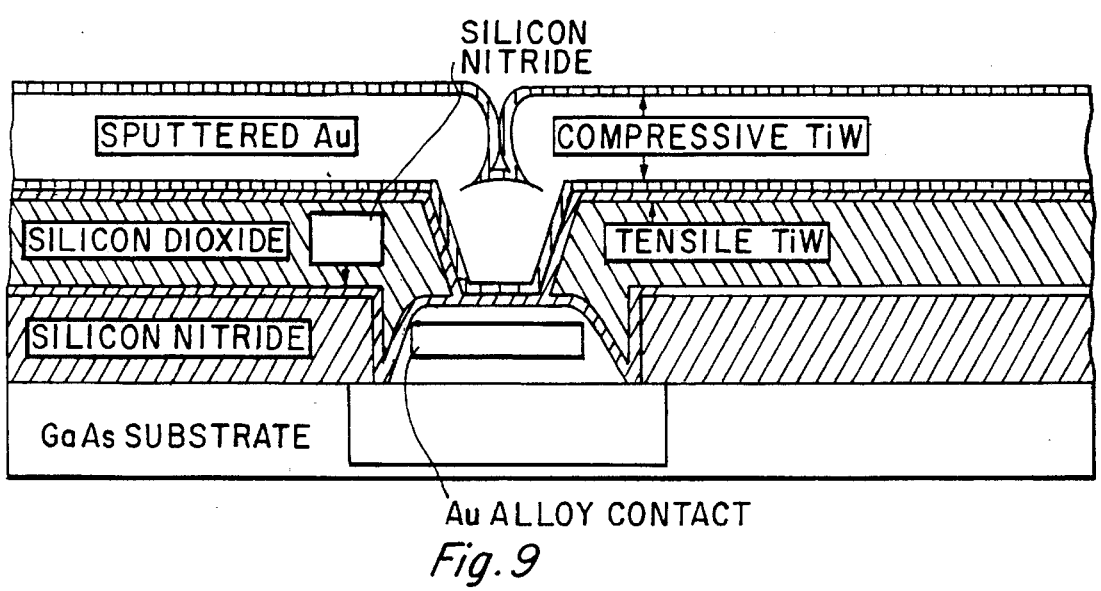
Figure 10:
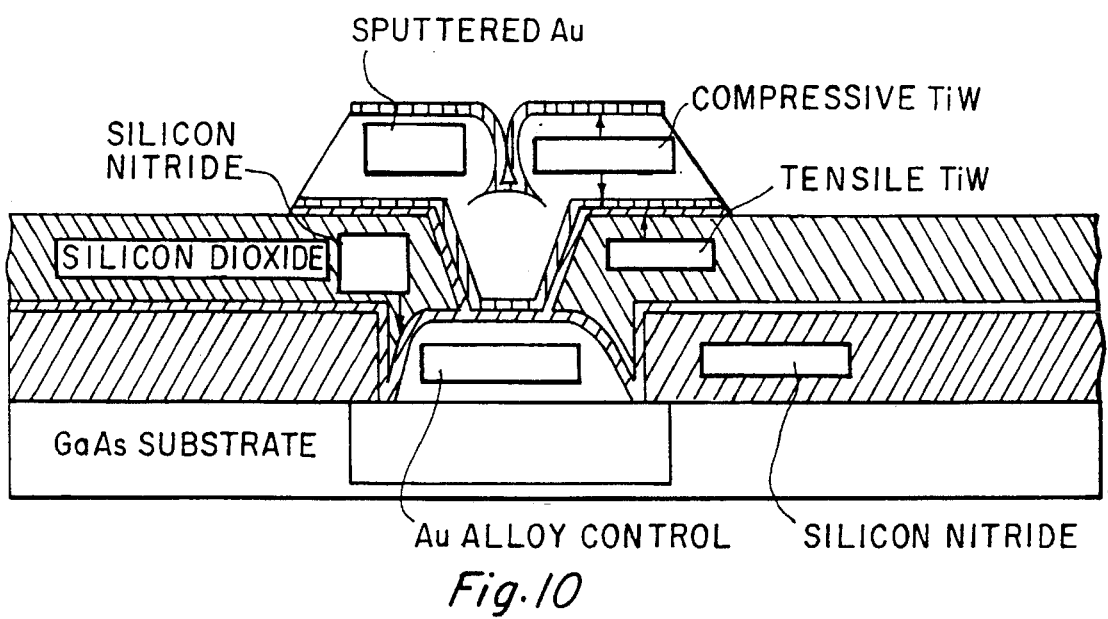
Figure 11:
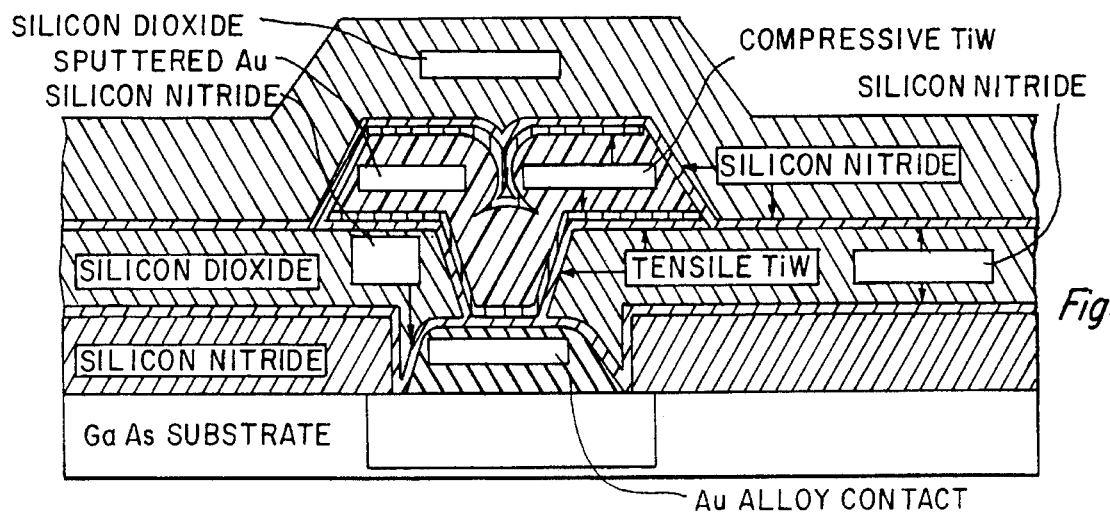

The wafer of FIG. 5 is then cleaned and a second dielectric layer 63 of 200 Angstroms of silicon nitride is formed over and along the side walls of the nitride layer 53 and over the alloy contact 59 by plasma or chemical vapor deposition (CVD) and a 6000 Angstrom layer of silicon dioxide 65 is then formed by CVD over the nitride layer 63. A layer of photoresist 67 is then patterned over the oxide layer 65 with an aperture therein over the contact 59 as shown in FIG. 6. A via is then etched through the oxide layer 65 and the thin nitride layer 63 over the contact 59 as shown in FIG. 7. The photoresist layer 67 is then removed as shown in FIG. 8. A layer of tensile TiW 69 is then sputter deposited over the silicon dioxide layer 65 followed by a layer 71 of compressive TiW. A layer of gold 73 is then sputtered over the TiW layer 71 and a layer of compressive TiW 75 is deposited over the gold layer 73 as shown in FIG. 9. The gold and TiW layers 69, 71, 73 and 75 are then removed except in the region over contact 59 after proper patterning as shown in FIG. 10. A layer of silicon nitride 73 followed by a layer of silicon dioxide 75 are then vapor deposited over the substrate of FIG. 10 as shown in FIG. 11. A via 77 is then etched in the silicon dioxide layer 75 in the region over the contact 59 to expose the connections to the contact 59 as shown in FIG. 12.

Figure 12:
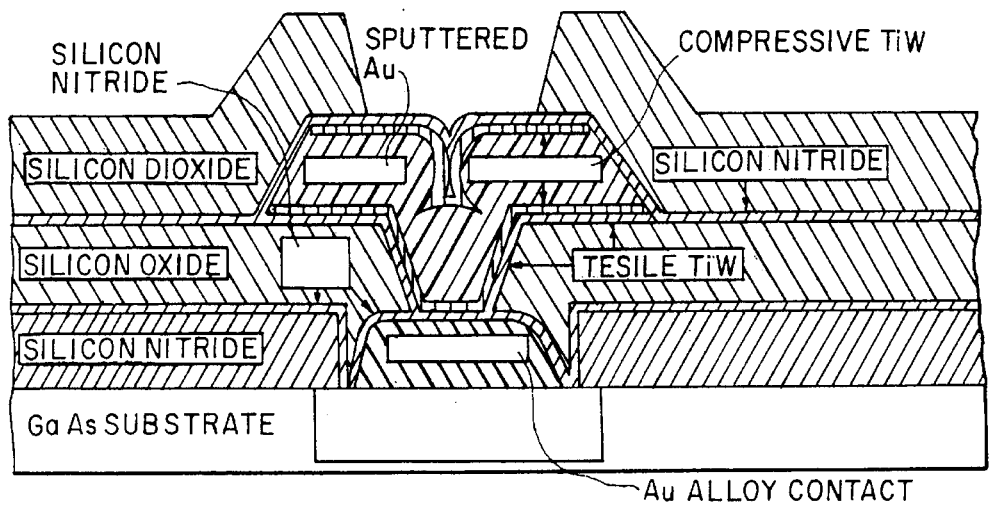
Figure 13:
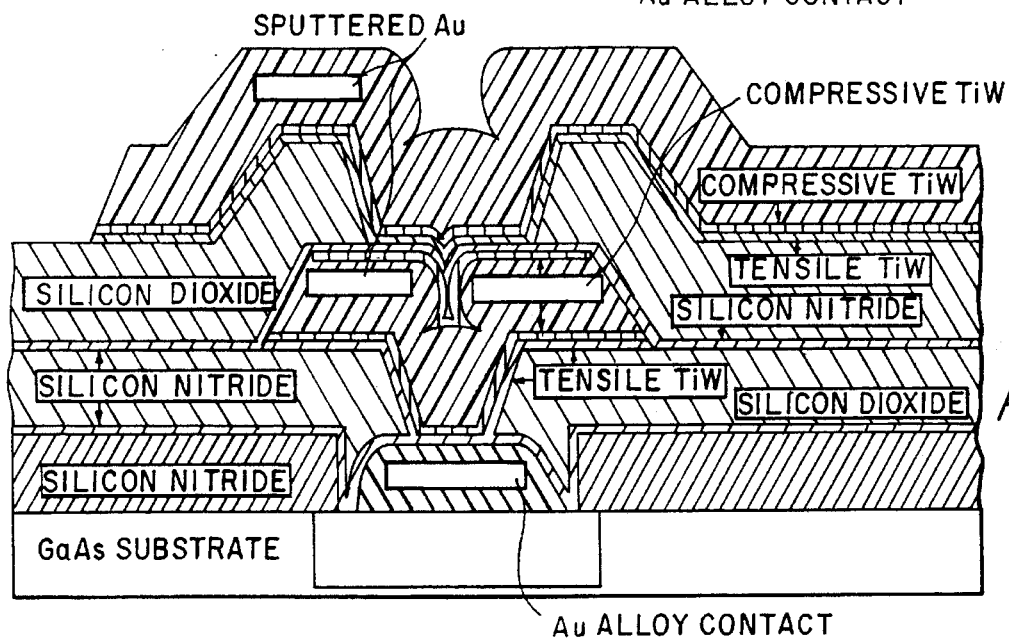

A second metal level is formed as shown in FIG. 13 by forming over the structure of FIG. 12 a layer 79 of tensile Tiw followed by a layer 81 of compressive TiW. A layer of gold 83 is then sputtered over the layers 79 and 81 to provided coupling to the contact 59 with the second level metal.

It can be seen that in accordance with the present invention, while all processing steps are standard and well known individually, an integrated circuit can be provided wherein the insulator layers display superior properties of adherence to the substrate without cracking the substrate, metallization displays superior properties of adherence to insulator, and wherein film resistors can be processed on line.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of fabricating a contact for a semiconductor integrated circuit which comprises the steps of:
    (a) providing a semiconductor substrate having a region thereon containing an oxide;
    (b) securing a first layer of tensile stressed TiW directly to said oxide;
    (c) securing a second layer of compressive stressed TiW directly to said first layer of tensile stressed TiW; and
    (d) securing a third layer of metal taken from the group consisting of gold and aluminum directly to said second layer of compressive stressed TiW.

2. The method of claim 1 wherein said metal is gold.

3. The method of claim 1 wherein the tensile stress of said first layer is about $1.1 \times 10^{10}$ dynes/centimeter$^2$ when the compressive stress of said second layer is about $1.0 \times 10^{10}$ dynes/centimeter$^2$ or the tensile stress of said first layer is about $2.1 \times 10^{10}$ dynes/cm$^2$ and the compressive stress of said second layer is about $2.0 \times 10^{10}$ dynes/cm$^2$ with the stress at the interface of said first and second layers being about $1 \times 10^9$ dynes/cm$^2$ tensile in either case.

4. The method of claim 2 wherein the tensile stress of said first layer is about $1.1 \times 10^{10}$ dynes/centimeter$^2$ when the compressive stress of said second layer is about $1.0 \times 10^{10}$ dynes/centimeter$^2$ or the tensile stress of said first layer is about $2.1 \times 10^{10}$ dynes/cm$^2$ and the compressive stress of said second layer is about $2.0 \times 10^{10}$ dynes/cm$^2$ with the stress at the interface of said first and second layers being about $1 \times 10^9$ dynes/cm$^2$ tensile in either case.

5. The method of claim 1, further including the steps of forming a via containing an insulating layer therein on said substrate prior to steps (b) through (d), said first, second and third layers extending over said insulating layer and into said via.

6. The method of claim 2, further including the steps of forming a via containing an insulating layer therein on said substrate prior to steps (b) through (d), said first, second and third layers extending over said insulating layer and into said via.

7. The method of claim 3, further including the steps of forming a via containing an insulating layer therein on said substrate prior to steps (b) through (d), said first, second and third layers extending over said insulating layer and into said via.

8. The method of claim 4, further including the steps of forming a via containing an insulating layer therein on said substrate prior to steps (b) through (d), said first, second and third layers extending over said insulating layer and into said via.

9. The method of claim 5 wherein said formation of said insulating layer comprises forming a layer of silicon nitride over said substrate; forming a layer of silicon oxide over and contiguous with said silicon nitride and remote from said substrate; said via formed through said layer of silicon nitride and said layer of silicon oxide having a portion of said first layer exposed on the side wall of said via.

10. The method of claim 6 wherein said formation of said insulating layer comprises forming a layer of silicon nitride over said substrate; forming a layer of silicon oxide over and contiguous with said silicon nitride and remote from said substrate; said via formed through said layer of silicon nitride and said layer of silicon oxide having a portion of said first layer exposed on the side wall of said via.

11. The method of claim 7 wherein said formation of said insulating layer comprises forming a layer of silicon nitride over said substrate; forming a layer of silicon oxide over and contiguous with said silicon nitride and remote from said substrate; said via formed through said layer of silicon nitride and said layer of silicon oxide having a portion of said first layer exposed on the side wall of said via.

12. The method of claim 8 wherein said formation of said insulating layer comprises forming a layer of silicon nitride over said substrate; forming a layer of silicon oxide over and contiguous with said silicon nitride and remote from said substrate; said via formed through said layer of silicon nitride and said layer of silicon oxide having a portion of said first layer exposed on the side wall of said via.

13. The method of claim 1 wherein the stress at the interface of said first layer and said second layer is about $1 \times 10^9$ dynes/cm$^2$ tensile.

14. The method of claim 2 wherein the stress at the interface of said first layer and said second layer is about $1 \times 10^9$ dynes/cm$^2$ tensile.

15. The method of claim 1 wherein the stress at said first layer is about $2.1 \times 10^{10}$ dynes/cm$^2$ tensile and the stress at said second layer is about $2.0 \times 10^{10}$ dynes/cm$^2$ compressive.

16. The method of claim 2 wherein the stress at said first layer is about $2.1 \times 10^{10}$ dynes/cm$^2$ tensile and the stress at said second layer is about $2.0 \times 10^{10}$ dynes/cm$^2$ compressive.

17. A method of fabricating a contact for a semiconductor integrated circuit which comprises the steps of:

(a) providing a semiconductor substrate having an oxide region thereon;

(b) securing a first layer of tensile stressed material which is directly securable to said oxide region to said oxide region;

(c) securing a second layer of compressive stressed material which is directly securable to said first layer of tensile stressed material and to one of gold and aluminum to said first layer of tensile stressed material; and (d) securing a third layer of metal taken from the group consisting of gold and aluminum directly to said second layer of compressive stressed material.

18. The method of claim 17 wherein the stress at the interface of said first layer and said second layer is about $1 \times 10^9$ dynes/cm$^2$ tensile.

19. The method of claim 17 wherein the tensile stress of said first layer is about $1.1 \times 10^{10}$ dynes/centimeter$^2$ when the compressive stress of said second layer is about $1.0 \times 10^{10}$ dynes/centimeter$^2$ or the tensile stress of said first layer is about $2.1 \times 10^{10}$ dynes/cm$^2$ and the compressive stress of said second layer is about $2.0 \times 10^{10}$ dynes/cm$^2$ with the stress at the interface of said first and second layers being about $1 \times 10^9$ dynes/cm$^2$ tensile in either case.

* * * * *